(12) United States Patent
Bae et al.

(10) Patent No.: US 12,349,271 B2
(45) Date of Patent: Jul. 1, 2025

(54) FLEXIBLE PRINTED CIRCUIT BOARD ASSEMBLY AND ELECTRONIC DEVICE INCLUDING THE SAME

(71) Applicant: SAMSUNG ELECTRONICS CO., LTD., Suwon-si (KR)

(72) Inventors: Bumhee Bae, Suwon-si (KR); Younghun Seong, Suwon-si (KR); Jaehoon Lee, Suwon-si (KR); Jeongnam Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 181 days.

(21) Appl. No.: 18/096,844

(22) Filed: Jan. 13, 2023

(65) Prior Publication Data
US 2023/0171881 A1    Jun. 1, 2023

Related U.S. Application Data

(63) Continuation of application No. PCT/KR2021/009649, filed on Jul. 26, 2021.

(30) Foreign Application Priority Data

Jul. 28, 2020 (KR) .......... 10-2020-0093906

(51) Int. Cl.
*H05K 1/02* (2006.01)
*B32B 3/08* (2006.01)
(Continued)

(52) U.S. Cl.
CPC .......... *H05K 1/028* (2013.01); *H05K 1/0272* (2013.01); *H05K 1/181* (2013.01); *G06F 1/1652* (2013.01);
(Continued)

(58) Field of Classification Search
CPC ........ H05K 1/02; H05K 1/028; H05K 1/0215; H05K 1/0216; H05K 1/0218;
(Continued)

(56) References Cited

U.S. PATENT DOCUMENTS 5,576,577 A     11/1996 Takenouchi et al.
5,626,686 A *    5/1997 Yoshida ............ H01L 31/03926
                                                         136/258
(Continued)

FOREIGN PATENT DOCUMENTS

EP       3961656 A1    3/2022
JP       8-125380 A    5/1996
(Continued)

OTHER PUBLICATIONS

Communication issued Oct. 9, 2023 by Intellectual Property India in Indian Patent Application No. 202317007804.
(Continued)

*Primary Examiner* — Xiaoliang Chen
(74) *Attorney, Agent, or Firm* — Sughrue Mion, PLLC

(57) ABSTRACT

A flexible printed circuit board (FPCB) assembly includes an electrically conductive layer configured to transmit a signal, a dielectric layer provided on the electrically conductive layer, a ground layer provided on the dielectric layer, and an auxiliary metal layer provided on or under the ground layer, and connecting a plurality of regions of the ground layer to each other, where the electrically conductive layer, the dielectric layer, the ground layer, and the auxiliary metal layer are flexible.

8 Claims, 8 Drawing Sheets

(51) Int. Cl.
    *B32B 7/06*           (2019.01)
    *B32B 7/12*           (2006.01)
    *B32B 15/09*          (2006.01)
    *B32B 15/20*          (2006.01)
    *B32B 27/26*          (2006.01)
    *B32B 27/36*          (2006.01)
    *H05K 1/18*           (2006.01)
    *H05K 3/22*           (2006.01)
    *H05K 9/00*           (2006.01)
    *G06F 1/16*           (2006.01)

(52) U.S. Cl.
    CPC .............. *H05K 2201/09063* (2013.01); *H05K 2201/093* (2013.01); *H05K 2201/10098* (2013.01); *H05K 2201/10128* (2013.01)

(58) Field of Classification Search
    CPC .. H05K 1/0219; H05K 1/0227; H05K 1/0242; H05K 1/0272; H05K 1/0277; H05K 1/0281; H05K 1/18; H05K 1/112; H05K 1/115; H05K 1/118; H05K 1/141; H05K 1/144; H05K 1/148; H05K 1/181; H05K 1/182; H05K 1/189; H05K 3/0094; H05K 3/22; H05K 3/225; H05K 3/281; H05K 3/321; H05K 3/4007; H05K 3/4038; H05K 9/00; H05K 9/0022; H05K 9/0075; H05K 9/0083; H05K 9/0084; H05K 9/0088; H05K 9/0086; H05K 2201/0715; H05K 2201/093; H05K 2201/09063; H05K 2201/10098; H05K 2201/10128; B32B 3/08; B32B 3/266; B32B 7/06; B32B 7/12; B32B 15/09; B32B 15/20; B32B 27/26; B32B 27/36; B32B 27/281; B32B 27/286; B32B 27/365; G06F 1/1652
    USPC ........ 361/749, 751, 792, 793; 174/250, 254, 174/260, 261, 262, 266, 394; 427/58, 427/963
    See application file for complete search history.

(56) References Cited

U.S. PATENT DOCUMENTS

| | | | |
|---|---|---|---|
| 5,834,705 A * | 11/1998 | Jonaidi | H05K 1/141 |
| | | | 174/254 |
| 8,263,873 B2 | 9/2012 | Choi et al. | |
| 8,847,184 B2 * | 9/2014 | Cheng | G21F 1/00 |
| | | | 250/515.1 |
| 10,079,425 B2 | 9/2018 | Chun et al. | |
| 10,159,143 B1 | 12/2018 | Su et al. | |
| 10,615,485 B2 | 4/2020 | Chun et al. | |
| 10,820,457 B1 * | 10/2020 | Kishi | H05K 1/0227 |
| 11,019,190 B2 | 5/2021 | Kim et al. | |
| 11,259,407 B2 | 2/2022 | Shim et al. | |
| 11,363,712 B2 | 6/2022 | Kim et al. | |
| 11,410,791 B2 | 8/2022 | Bae et al. | |
| 11,431,076 B2 | 8/2022 | Chun et al. | |
| 11,444,363 B2 | 9/2022 | Bae et al. | |
| 2006/0079785 A1 * | 4/2006 | Hosono | G10K 11/02 |
| | | | 600/459 |
| 2006/0284183 A1 * | 12/2006 | Izumi | H01L 27/1277 |
| | | | 257/E27.113 |
| 2007/0148575 A1 * | 6/2007 | Mishra | G03G 5/14752 |
| | | | 430/66 |
| 2008/0169349 A1 * | 7/2008 | Suzuki | H01L 27/1266 |
| | | | 257/E27.111 |
| 2008/0296048 A1 * | 12/2008 | Muro | H05K 1/0218 |
| | | | 174/254 |
| 2009/0038839 A1 | 2/2009 | Hashimoto et al. | |
| 2010/0043223 A1 | 2/2010 | Heisen et al. | |
| 2010/0096167 A1 | 4/2010 | Choi et al. | |
| 2011/0308841 A1 * | 12/2011 | Kawaguchi | H05K 1/0218 |
| | | | 428/141 |
| 2012/0228009 A1 * | 9/2012 | Muro | H05K 1/0218 |
| | | | 174/254 |
| 2013/0092428 A1 * | 4/2013 | Kawaguchi | H05K 1/0218 |
| | | | 174/250 |
| 2014/0240178 A1 | 8/2014 | Chun et al. | |
| 2015/0009637 A1 * | 1/2015 | Kawaguchi | H05K 1/0216 |
| | | | 156/247 |
| 2015/0130683 A1 | 5/2015 | Kato et al. | |
| 2016/0027548 A1 | 1/2016 | Burnham et al. | |
| 2018/0053981 A1 | 2/2018 | Bae et al. | |
| 2018/0139841 A1 * | 5/2018 | Hu | H05K 3/4038 |
| 2018/0181163 A1 * | 6/2018 | Shin | H04M 1/0277 |
| 2018/0358684 A1 | 12/2018 | Chun et al. | |
| 2019/0261503 A1 * | 8/2019 | Haruna | H01R 4/04 |
| 2020/0028949 A1 | 1/2020 | Kim et al. | |
| 2020/0040231 A1 * | 2/2020 | Aoyagi | H05K 1/18 |
| 2020/0235459 A1 | 7/2020 | Chun et al. | |
| 2020/0265971 A1 * | 8/2020 | Bae | H05K 1/148 |
| 2020/0329557 A1 * | 10/2020 | Kim | H05K 1/0277 |
| 2020/0359493 A1 | 11/2020 | Bae et al. | |
| 2021/0020329 A1 | 1/2021 | Bae et al. | |
| 2021/0059042 A1 * | 2/2021 | Yamauchi | H05K 9/0088 |
| 2021/0288390 A1 | 9/2021 | Tago | |
| 2022/0030699 A1 * | 1/2022 | Haruna | H05K 1/115 |
| 2022/0046788 A1 * | 2/2022 | Haruna | H05K 9/0084 |
| 2022/0061150 A1 | 2/2022 | Aoyagi et al. | |

FOREIGN PATENT DOCUMENTS

| | | |
|---|---|---|
| JP | 2001-176937 A | 6/2001 |
| JP | 2009-218443 A | 9/2009 |
| JP | 2009-218447 A | 9/2009 |
| KR | 10-0125116 B1 | 12/1997 |
| KR | 10-0888063 B1 | 3/2009 |
| KR | 10-2014-0105886 A | 9/2014 |
| KR | 10-1507268 B1 | 3/2015 |
| KR | 10-2018-0019472 A | 2/2018 |
| KR | 10-2019-0110371 A | 9/2019 |
| KR | 10-2020-0009251 A | 1/2020 |
| KR | 10-2020-0101006 A | 8/2020 |
| KR | 10-2020-0129341 A | 11/2020 |
| KR | 10-2021-0009972 A | 1/2021 |
| KR | 10-2021-0012364 A | 2/2021 |
| KR | 10-2021-0016774 A | 2/2021 |
| KR | 10-2021-0062188 A | 5/2021 |
| KR | 10-2021-0089342 A | 7/2021 |
| WO | 2020/017836 A1 | 1/2020 |
| WO | 2020/116409 A1 | 6/2020 |
| WO | 2020/130010 A1 | 6/2020 |
| WO | 2020/171397 A1 | 8/2020 |
| WO | 2020-226277 A1 | 11/2020 |
| WO | 2020/235787 A1 | 11/2020 |

OTHER PUBLICATIONS

Communication issued on Nov. 8, 2023 by the European Patent Office in European Application No. 21849858.2.
International Search Report (PCT/ISA/210) dated Nov. 25, 2021 issued by the International Searching Authority in International Application No. PCT/KR2021/009649.
Written Opinion (PCT/ISA/237) dated Nov. 25, 2021 issued by the International Searching Authority in International Application No. PCT/KR2021/009649.
Communication dated Jan. 21, 2025, issued by the Korean Intellectual Property Office in Korean Application No. 10-2020-0093906.
Communication issued May 16, 2025 by the European Patent Office in European Patent Application No. 21849858.2.

* cited by examiner

FLEXIBLE PRINTED CIRCUIT BOARD ASSEMBLY AND ELECTRONIC DEVICE INCLUDING THE SAME

CROSS-REFERENCE TO RELATED APPLICATIONS

This application is a bypass continuation of International Application No. PCT/KR2021/009649, filed on Jul. 26, 2021 in the Korean Intellectual Property Receiving Office, which is based on and claims priority to Korean Patent Application No. 10-2020-0093906, filed on Jul. 28, 2020, in the Korean Intellectual Property Office, the disclosures of which are incorporated by reference herein in their entireties.

BACKGROUND

1. Field

The disclosure relates to a flexible printed circuit board (FPCB) assembly and an electronic device including the same, and more particularly, to an FPCB assembly including an auxiliary metal layer disposed on or under a ground layer, and an electronic device including the same.

2. Description of Related Art

A flexible printed circuit board (FPCB), which is a printed circuit board having flexibility, is advantageous in reducing a size and a weight with strong durability and heat resistance. Thus, FPCBs have been used in electronic devices that need to have a small size while having high performance, such as in mobile phones, laptop computers, cameras, computer peripherals, and display devices.

However, in a situation where fatigue is accumulated in a bendable portion of an FPCB assembly, in a situation where there is a perforated region in an FPCB assembly, or the like, a crack may occur in a plate-shaped grounding layer of the FPCB assembly, resulting in the continuity of the ground layer being cut off, and in a current not flowing smoothly.

In particular, in a case where the FPCB assembly is applied to a high-performance flexible electronic device or transmits a signal in a high frequency band, a movement of a current may be blocked and a resonance may occur in the crack portion of the ground layer, resulting in a degradation in performance of the FPCB assembly.

SUMMARY

Provided are a flexible printed circuit board (FPCB) including an auxiliary metal layer disposed on or under a ground layer to have ultra-high bendability and stability, and an electronic device including the same.

Additional aspects will be set forth in part in the description which follows and, in part, will be apparent from the description, or may be learned by practice of the presented embodiments.

According to an aspect of the disclosure, an FPCB assembly may include an electrically conductive layer configured to transmit a signal, a dielectric layer provided on the electrically conductive layer, a ground layer provided on the dielectric layer, and an auxiliary metal layer provided on or under the ground layer, and connecting a plurality of regions of the ground layer to each other, where the electrically conductive layer, the dielectric layer, the ground layer, and the auxiliary metal layer are flexible.

The auxiliary metal layer may be interposed between the dielectric layer and the ground layer, the auxiliary metal layer may include an adhesive material and electrically conductive particles in the adhesive material, and the adhesive material may bond the dielectric layer to the ground layer.

The FPCB assembly may include a bendable region, and the electrically conductive particles of the auxiliary metal layer may be provided in the bendable region.

The auxiliary metal layer may be interposed between the dielectric layer and the ground layer, and the auxiliary metal layer may include a plurality of pillars having an "I"-shaped cross section and an adhesive material provided between the plurality of pillars to bond the dielectric layer and the ground layer.

The FPCB assembly may include a bendable region, and the auxiliary metal layer may include a bridge provided on the ground layer and connecting regions around the bendable region to each other.

The FPCB assembly may include a ground protecting layer provided on the auxiliary metal layer and formed of a dielectric.

Each of the ground protecting layer and the dielectric layer comprise a same type of material.

The FPCB assembly may include a perforated region in which a degassing hole penetrating through the FPCB assembly in a vertical direction is formed, and the auxiliary metal layer may be provided adjacent to the perforated region.

According to an aspect of the disclosure, an electronic device may include a flexible display, a first antenna provided on a first side with respect to a foldable region of the flexible display, a second antenna provided on a second side with respect to the foldable region of the flexible display, an FPCB assembly connecting the first antenna and the second antenna to each other. The FPCB assembly may include an electrically conductive layer configured to transmit a signal, a dielectric layer provided on the electrically conductive layer, a ground layer provided on the dielectric layer and connecting the first antenna and the second antenna to each other, and an auxiliary metal layer provided on or under the ground layer and connected to the ground layer in a plurality of regions.

The auxiliary metal layer may be interposed between the dielectric layer and the ground layer, the auxiliary metal layer may include an adhesive material and electrically conductive particles in the adhesive material, and the adhesive material may bond the dielectric layer to the ground layer.

The FPCB assembly may include a bendable region, and the electrically conductive particles of the auxiliary metal layer may be provided in the bendable region.

The auxiliary metal layer may be interposed between the dielectric layer and the ground layer, and the auxiliary metal layer may include a plurality of pillars having an "I"-shaped cross section and an adhesive material provided between the plurality of pillars to bond the dielectric layer and the ground layer to each other.

The FPCB assembly may include a bendable region, and the auxiliary metal layer may include a bridge provided on the ground layer and connecting regions around the bendable region to each other.

The electronic device may include a ground protecting layer provided on the auxiliary metal layer and formed of a dielectric.

The FPCB assembly may include a perforated region in which a degassing hole penetrating through the FPCB assembly in a vertical direction is formed, and the auxiliary metal layer may be provided adjacent to the perforated region.

According to an aspect of the disclosure, an FPCB assembly may include an electrically conductive layer, a dielectric layer provided on the electrically conductive layer, a ground layer provided on the dielectric layer, and an electrically conductive adhesive layer provided on the ground layer, where the electrically conductive adhesive layer includes an adhesive material bonding the dielectric layer to the ground layer, and an electrically conductive material mixed in the adhesive material.

The FPCB assembly may include a bendable region, the electrically conductive material may be provided in the bendable region, and the adhesive material may be provided in areas outside of the bendable region.

The electrically conductive adhesive layer may include a plurality of pillars having an "I"-shaped cross section formed of the electrically conductive material.

The FPCB assembly may include a bendable region where the plurality of pillars are provided in the bendable region.

The FPCB assembly may include a bendable region, and the electrically conductive material may have anisotropic conductivity in a vertical direction in areas outside of the bendable region.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Embodiments of the disclosure will now be described with reference to the accompanying drawings to fully understand configurations and effects of the disclosure. However, the disclosure should not be construed as being limited to embodiments set forth hereinbelow, and may be embodied in various different forms and modified in various ways. Rather, the embodiments will be described so that the disclosure will be thorough and complete, and will fully convey the scope of the disclosure to those skilled in the art. In the accompanying drawings, the sizes of components are exaggerated as compared with actual ones for convenience of explanation, and a ratio between the sizes of the components may be enlarged or reduced.

The terms used in the disclosure and the claims are general terms selected from general terms in consideration of functions in the disclosure. However, these terms may vary depending on intentions of those skilled in the art, legal or technical interpretation, emergence of new technologies, and the like. Also, some terms may be arbitrarily selected by the applicant. These terms may be construed as meanings defined in the disclosure, and may be construed based on the entire text of the disclosure and the common technical knowledge in the art unless specifically defined.

In the disclosure, the expressions "have", "may have", "include", "may include", and the like indicate the presence of stated features (e.g., numbers, functions, operations, or components such as parts), but do not preclude the presence or additional features.

In addition, the terms such as "front surface", "rear surface", "upper surface", "lower surface", "side surface", "left side", "right side", "upper portion", "lower portion", and "region" used in the disclosure are defined based on the drawings, and the shapes and positions of the components are not limited by these terms.

In addition, herein, components required for describing each embodiment of the disclosure are described, and the embodiment is not necessarily limited thereto. Therefore, some components may be changed or omitted and other components may be added. In addition, components may be arranged in different independent devices in a distributed manner.

Furthermore, embodiments of the disclosure will hereinafter be described in detail with reference to the accompanying drawings and contents described in the accompanying drawings, but the disclosure is not limited or restricted by the embodiments.

Hereinafter, the disclosure will be described in more detail with reference to FIGS. 1 to 8.

Figure 1:
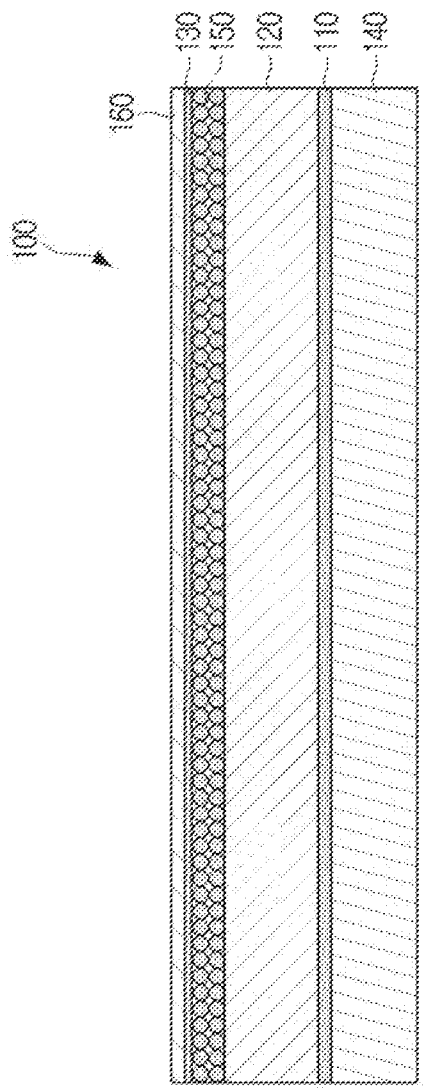
FIG. 1 is a cross-sectional view illustrating a flexible printed circuit board (FPCB) assembly according to an embodiment of the disclosure.

FIG. 1 is a cross-sectional view illustrating a flexible printed circuit board (FPCB) assembly 100 according to an embodiment of the disclosure.

Referring to FIG. 1, the FPCB assembly 100 may include an electrically conductive layer 110, a dielectric layer 120, a ground layer 130, an auxiliary metal layer 150, an electrical conduction protecting layer 140, and a ground protecting layer 160.

It should be noted that, the term "layer" may hereinafter be understood as one continuous plane in a cross-sectional view in one direction, but is not limited thereto. The term "layer" may refer to a cross section of a "wire" such as a conducting wire or a ground wire or a "structure" such as a bridge, which will be described as a "layer" for convenience of description.

The FPCB assembly 100 is a substrate on which components of FPCB are assembled together. A printed circuit board (PCB) generally refers to a thin plate to which electrical parts such as integrated circuits, resistors, or switches are soldered, and may be used in an electronic device such as a computer and a mobile phone in various ways.

The FPCB assembly 100 has a bendable characteristic, because each of the components of the FPCB assembly 100, such as the electrically conductive layer 110, the dielectric layer 120, the ground layer 130, the auxiliary metal layer 150, and the electrical conduction protecting layer 140, is flexible. As a result, the FPCB assembly 100 has high durability and heat resistance, and may be suitable for use in a small-size electronic device. Therefore, the purpose and the performance of the FPCB assembly 100 is not limited, and the FPCB assembly 100 may be applied to a cable, an antenna, or the like for transmitting an electrical signal as in an embodiment of the disclosure.

The electrically conductive layer 110 is a layer for transmitting a signal. The electrically conductive layer 110 may be formed of a conductor (e.g., copper, silver, platinum, iron, aluminum, titanium, or gold). The electrically conductive layer 110 may transmit a signal in one direction from one end to the other end thereof, and may be an electric wire having a vertical cross section in a plate shape, a circular shape, or a quadrilateral shape.

The dielectric layer 120 may be disposed on the electrically conductive layer 110. The dielectric layer 120 may be formed of a dielectric (e.g., a polyimide (PI) resin, an epoxy resin, or a liquid crystal polymer (LCP)), and the dielectric may also contain a reinforcing material such as a glass cloth or an inorganic filler (e.g., silica).

The dielectric layer 120 may physically and electrically protect the electrically conductive layer 110 from impact. Specifically, an electrical signal in the electrically conductive layer 110 needs to be transmitted to a target position quickly and accurately. If a leakage occurs during transmission, an erroneous signal may be transmitted or power efficiency may deteriorate. However, the dielectric forming the dielectric layer 120 is an insulating material capable of electrically preventing an electrical signal from being leaked.

The dielectric layer 120 may be formed of a low signal loss dielectric. The development of communication technology increases a signal processing speed and a signal processing capacity, making it possible to transmit an electrical signal having a higher frequency and a broader bandwidth through the electrically conductive layer 110. Therefore, in order to minimize leakages in the process of transmitting electric signals, the dielectric layer 120 according to the disclosure may be formed of a low signal loss dielectric, thereby minimizing signal loss during the transmission of the electric signals through the electrically conductive layer 110.

The ground layer 130 and the auxiliary metal layer 150 will be described in detail with reference to FIG. 2, and the electrical conduction protecting layer 140 will be described in detail with reference to FIG. 6.

The ground protecting layer 160 is disposed on the ground layer 130, and may be made of a dielectric. The dielectric of the ground protecting layer 160 may be of the same type of material as the dielectric of the dielectric layer 120 described above, or may be of one of the several types of dielectrics exemplified as a material of the dielectric layer 120.

The ground protecting layer 160 may protect the ground layer 130 from external impact, and may protect the ground layer 130 so that another element does not intervene in a current flow therein.

In a case where the auxiliary metal layer 150 is disposed on the ground layer 130, the ground protecting layer 160 may be disposed on the auxiliary metal layer 150.

The ground protecting layer 160 strongly adheres to the ground layer 130. If a crack occurs in the ground layer 130, a corresponding portion of the ground protecting layer 160 may be broken together with the ground layer 130.

Figure 2:
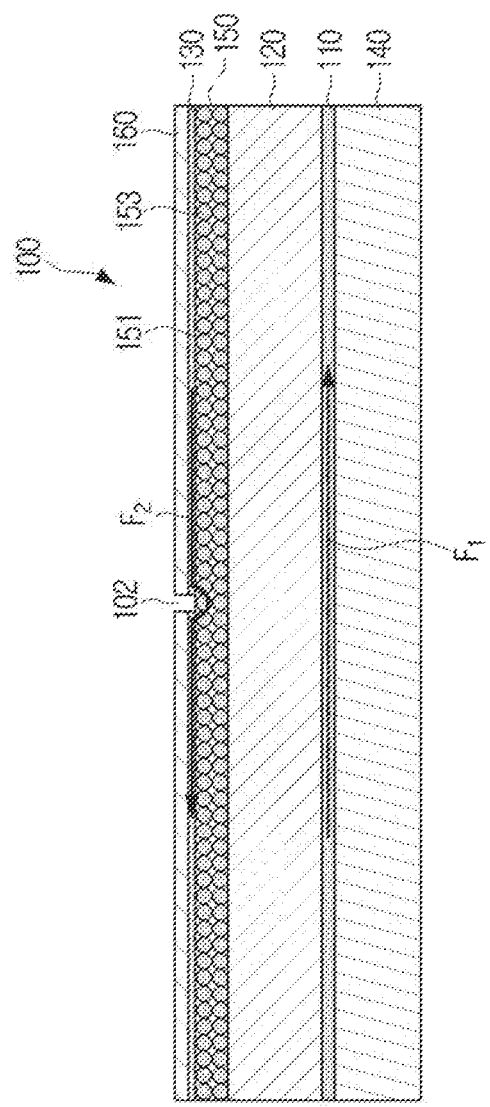
FIG. 2 is a cross-sectional view illustrating an FPCB assembly in a state where a crack has occurred according to an embodiment of the disclosure.

FIG. 2 is a cross-sectional view illustrating the FPCB assembly 100 in a state where a crack 102 has occurred according to an embodiment of the disclosure.

Referring to FIG. 2, a crack 102 may occur in the ground layer 130, and a flow $F_2$ of a current to the ground layer 130 and the auxiliary metal layer 150 may occur to correspond to a flow $F_1$ of an electrical signal in the electrically conductive layer 110.

The ground layer 130 may be disposed on the dielectric layer 120, and a current may move in the ground layer 130 in an opposite-direction flow to correspond to the signal transmission in the electrically conductive layer 110.

The ground layer 130 may have a planar shape with a large area, and may have weak flexibility as compared to the other structures of the FPCB assembly 100. Thus, the bendability of the ground layer 130 may not be good. Therefore, if fatigue is accumulated (e.g., due to the FPCB assembly 100 being repeatedly bent), the ground layer 130 may be broken, causing an occurrence of a crack 102.

In particular, to correspond to an increase in frequency of a signal processed by the electrically conductive layer 110, there is an increase in frequency of a signal in an opposite-direction flow in the ground layer 130. Accordingly, if a crack 102 occurs in the ground layer 130 and a movement of a current is disturbed, a resonance phenomenon may occur in the vicinity of the crack 102.

The auxiliary metal layer 150 may be disposed on or under the ground layer 130 and adjacent to the ground layer 130, and may electrically connect a plurality of regions of the ground layer 130 to each other.

In order to minimize a current flow to the auxiliary metal layer 150 in a situation where a crack 102 does not occur in the ground layer 130, the auxiliary metal layer 150 may be formed of a material having a higher electrical resistance than the material of the ground layer 130. In addition, the auxiliary metal layer 150 may be formed of a conductor allowing a current to flow therethrough. Thus, when a crack 102 occurs in the ground layer 130, two broken parts are electrically connected to each other such that the current continues to flow.

The auxiliary metal layer 150 may be disposed between the dielectric layer 120 and the ground layer 130, and may be an electrically conductive adhesive layer in which electrically conductive particles 153 are mixed in an adhesive material 151 bonding the dielectric layer 120 and the ground layer 130 to each other. As described herein, the auxiliary metal layer 150 may be interchangeably referred to as the electrically conductive adhesive layer 150 with similar reference numerals.

The adhesive material may include an adhesive resin for bonding the dielectric layer 120 and the ground layer 130 to each other (e.g., a polyester-based resin, an acryl-based resin, an epoxy-based resin, a silicone-based resin, or a urethane-based resin).

The electrically conductive particles 153 may be metal inorganic particles such as silver, nickel, copper, or graphite, with isotropic electrical conductivity, and a current may flow through the electrically conductive particles in vertical and horizontal directions.

The electrically conductive adhesive layer 150 may be applied to the ground layer 130, which is to be disposed on the electrically conductive adhesive layer 150, placed on the dielectric layer 120, and then softened by heating to a temperature that softens the adhesive material 151 or a higher temperature, to serve to bond the ground layer 130 and the dielectric layer 120 to each other.

In the electrically conductive adhesive layer 150, as in FIG. 2, a flow $F_1$ of an electrical signal in one direction in the electrically conductive layer 110 causes a flow $F_2$ of a current in the opposite direction in the ground layer 130 to correspond thereto. However, a crack 102 may occur and the continuity of the ground layer 130 may be cut off, and as a result, the flow $F_2$ of the current in the ground layer 130 may be stopped and a resonance may occur. In this situation, the flow $F_2$ of the current to the electrically conductive adhesive layer 150 may bypass the ground layer 130, maintaining the continuity of the flow $F_2$ of the current in the ground layer 130.

When a crack 102 occurs in the ground layer 130, a current flow is blocked, which may cause an issue in signal transmission in the electrically conductive layer 110, and in turn cause a resonance. However, the auxiliary metal layer 150 makes it possible to form a flow $F_2$ of a current in the ground layer 130 even if a crack 102 occurs, and accordingly, form a flow $F_1$ of an electrical signal to correspond thereto. As a result, the bendability and durability of the FPCB assembly 100 can be improved.

Figure 3:
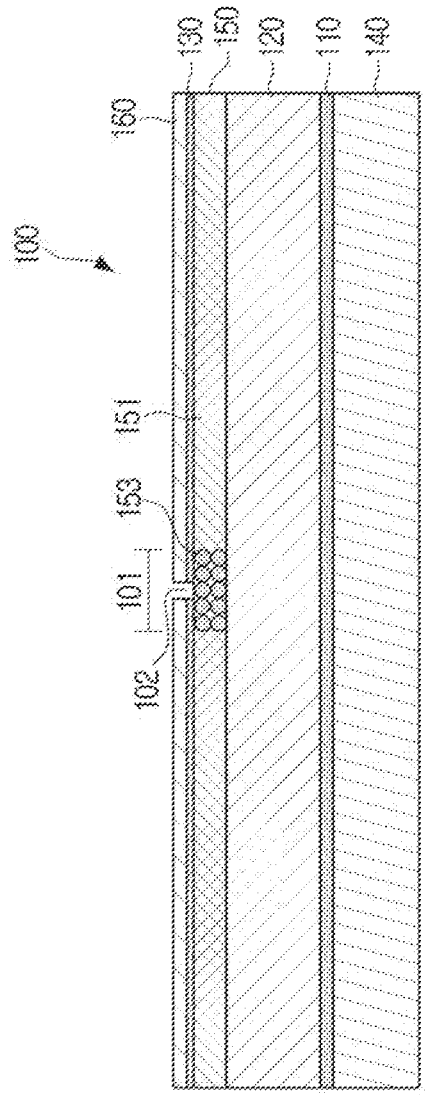
FIG. 3 is a cross-sectional view illustrating an FPCB assembly in a state where a crack has occurred according to an embodiment of the disclosure.

FIG. 3 is a cross-sectional view illustrating an FPCB assembly 100 in a state where a crack 102 has occurred according to an embodiment of the disclosure.

Referring to FIG. 3, the FPCB assembly 100 may include a bendable region 101.

The FPCB assembly 100 may be bent intensively in a specific area according to a function and an operation of an electronic device including the same. For example, the FPCB assembly 100 may be disposed in a foldable region of a flexible display, or the FPCB assembly 100 may function to connect a first antenna and a second antenna disposed on the left and right sides of the flexible display, respectively. In this case, the FPCB assembly 100 may be bent only in a specific direction mainly in the foldable region, and the foldable region may be referred to as a bendable region 101.

The electrically conductive particles 153 may be disposed in the bendable region 101 of electrically conductive adhesive layer 150. Accordingly, the adhesive material 151 may be disposed in the electrically conductive adhesive layer 150 in areas outside of the bendable region 101. Alternatively, the electrically conductive particles 153 may be disposed to have anisotropic conductivity in the vertical direction in the electrically conductive adhesive layer 150 in areas outside of the bendable region 101.

The bendable region 101 may be a region in which bending occurs repeatedly, and thus, it is highly likely that a crack 102 may occur in a region of the ground layer 130 corresponding to the bendable region. Therefore, by arranging the electrically conductive particles 153 in a region where a crack 102 is highly likely to occur (e.g., the bendable region 101), it is possible to prevent a current from flowing into the electrically conductive particles 153 in a situation where a crack 102 does not occur. In some embodiments, the electrically conductive particles 153 may be provided only in the bendable region 101.

Such an FPCB assembly 100 may be manufactured by making a hole in the adhesive material 151 and injecting the electrically conductive particles 153 into the hole before the ground layer 130 is laminated in the manufacturing process.

Figure 4:
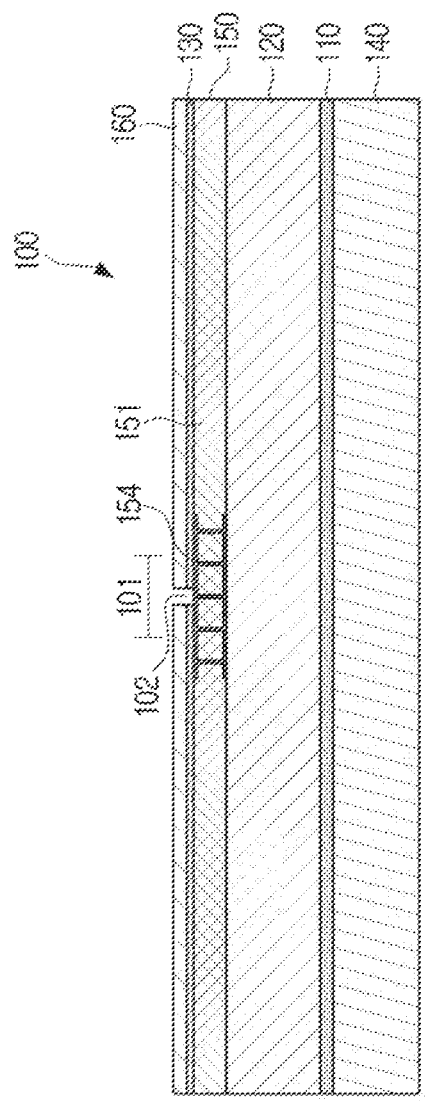
FIG. 4 is a cross-sectional view illustrating an FPCB assembly in a state where a crack has occurred according to an embodiment of the disclosure.

FIG. 4 is a cross-sectional view illustrating an FPCB assembly 100 in a state where a crack 102 has occurred according to an embodiment of the disclosure.

Referring to FIG. 4, the auxiliary metal layer 150 is disposed between the dielectric layer 120 and the ground layer 130, and may be an electrically conductive adhesive layer 150 in which a plurality of pillars 154 are mixed with an adhesive material 151.

Each of the plurality of pillars 154 may have an "I"-shaped cross section. In another cross-sectional view, each of the plurality of pillars 154 may have such a shape such that two metal plates spaced apart from each other are bonded to the pillar connecting the two metal plates.

The plurality of pillars 154 may be formed of a metal such as silver, nickel, copper, or graphite. Upper plates of the plurality of pillars 154 may meet together to form a flat metal layer in a continuous shape, thereby more efficiently inducing a flow $F_2$ of a current in the ground layer 130 to the auxiliary metal layer 150. Lower plates of the plurality of pillars 154 may support the pillars 154, and may have a smaller cross section than the upper plate, or may be omitted so that the plurality of pillars 154 may have a 'T'-shaped cross section or a cross section in various shapes.

The electrically conductive adhesive layer 150 may be manufactured by arranging the plurality of pillars 154, and then filling spaces therebetween with the adhesive material 151 in the manufacturing process.

Also in the electrically conductive adhesive layer 150 in which the plurality of pillars 154 are mixed, the plurality of pillars 154 may be disposed in a bendable region 101.

Figure 5:
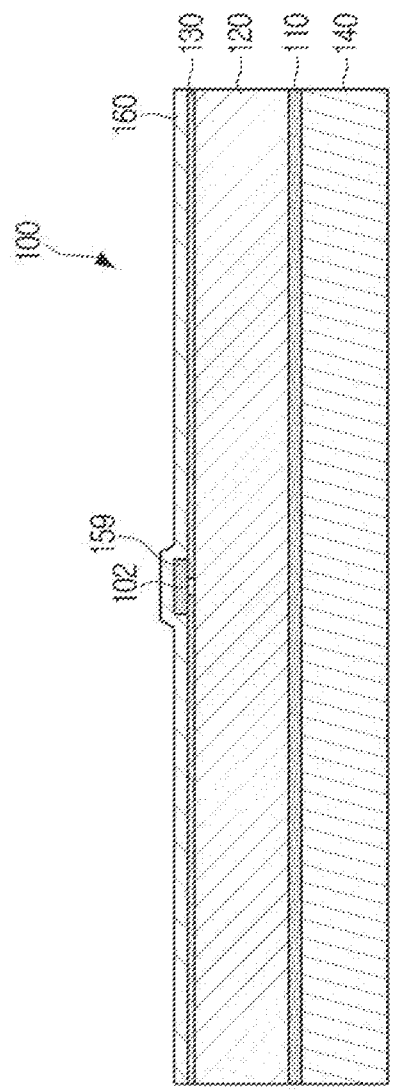
FIG. 5 is a cross-sectional view illustrating an FPCB assembly in a state where a crack has occurred according to an embodiment of the disclosure.

FIG. 5 is a cross-sectional view illustrating an FPCB assembly 100 in a state where a crack 102 has occurred according to an embodiment of the disclosure.

Referring to FIG. 5, the auxiliary metal layer is disposed on the ground layer 130, and may be formed as a bridge 159 electrically connecting regions around a bendable region to each other.

In a case where the bridge 159 is disposed on the ground layer 130, the ground layer 130 may be in contact with the dielectric layer 120. In the FPCB assembly 100 of FIG. 5 may further include a separate layer formed of an adhesive material (e.g., adhesive material 151 of FIGS. 2-4).

The bridge 159 may have a plate-shaped cross section as in FIG. 5 or a dome-shaped cross section. The bridge 159 may be disposed on and electrically connected to the ground layer 130, and the ground protecting layer 160 may be disposed on the bridge 159.

The bridge 159 may be formed of a metal material such as silver, nickel, copper, or graphite. The bridge 159 may be formed of a single material or multiple materials, and may be formed of different materials in the horizontal direction while having an angled shape, thereby securing flexibility in the horizontal direction.

The bridge 159 may connect peripheral regions adjacent to the bendable region 101. The bridge 159 may be disposed to selectively connect an area where a crack 102 occurs or an area requiring smooth current movement in the ground layer.

In addition, as the bridge 159, which may be an auxiliary metal layer, is disposed on the ground layer 130, the bridge 159 may be coupled to the FPCB assembly 100 in which the crack 102 has occurred after the process of manufacturing the FPCB assembly 100.

Figure 6:
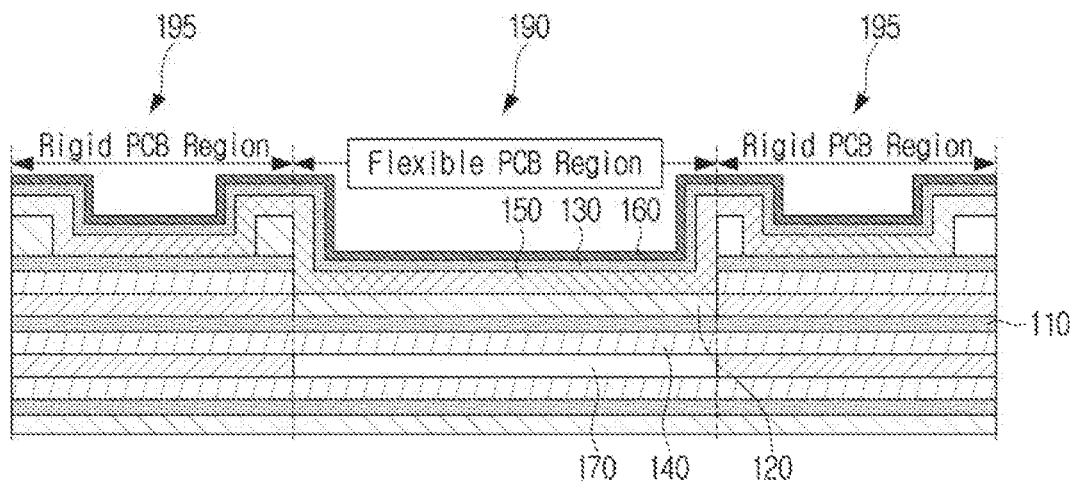
FIG. 6 is a cross-sectional view illustrating a PCB structure including an FPCB assembly according to an embodiment of the disclosure.

FIG. 6 is a cross-sectional view illustrating a PCB structure including an FPCB assembly according to an embodiment of the disclosure.

Referring to FIG. 6, a rigid PCB (RPCB) assembly may be positioned adjacent to a side surface of the FPCB assembly, and the FPCB assembly may further include an electrical conduction protecting layer 140 and a void 170.

A PCB assembly may include an FPCB assembly region (a flexible PCB region) 190 and an RPCB assembly region (rigid PCB region) 195. In a case where the PCB assembly is bent only in a specific region according to the purpose of the PCB assembly, a non-bent region of the PCB assembly may be an RPCB assembly region 190 in which the electrically conductive layer 110, the dielectric layer 120, the ground layer 130, etc., have no flexibility or weak flexibility.

The electrical conduction protecting layer 140 may be disposed under the electrically conductive layer 110 to protect the electrically conductive layer 110 like the dielectric layer 120.

The electrical conduction protecting layer 140 may be formed of the same type of material as the dielectric, and the dielectric of the electrical conduction protecting layer 140 is of the same type of material as the dielectric of the dielectric layer 120 described above, or may be of one of the several types of dielectrics exemplified as a material of the dielectric layer 120. In addition, a void 170 may be formed under the electrical conduction protecting layer 140.

Figure 7:
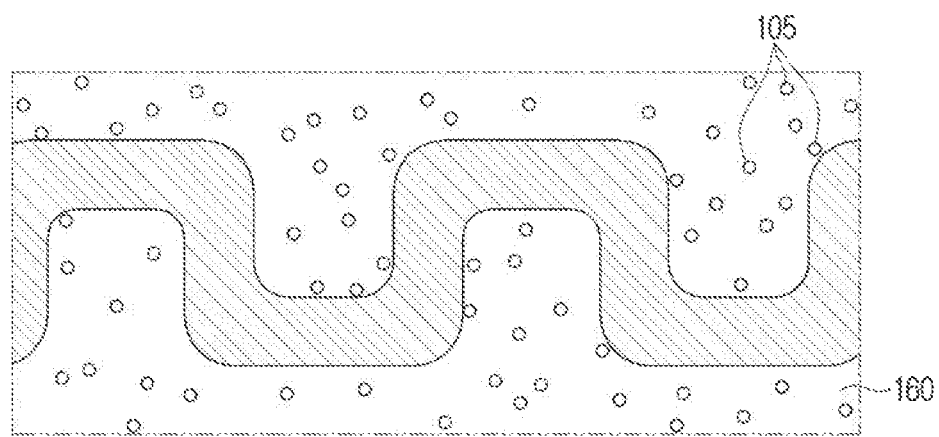
FIG. 7 is a diagram of a ground protecting layer according to an embodiment of the disclosure.

FIG. 7 is a diagram of a ground protecting layer 160 according to an embodiment of the disclosure.

Referring to FIGS. 2-7, the ground protecting layer 160 may include a perforated region 105.

The perforated region 105 may be a region in which a degassing hole penetrating through the FPCB assembly 100 in the vertical direction is formed.

In order to prevent inter-layer delamination in the stack structure of the FPCB assembly 100, a degassing hole may be drilled in the vertical direction (the stacked vertical direction) of the FPCB assembly 100.

Referring to FIGS. 2 through 7, a peripheral region adjacent to the perforated region 105 is highly likely to be cracked particularly in the ground layer 130 having weak flexibility, among the layers of the FPCB assembly 100, due to the perforation. Therefore, since a crack 102 is highly likely to occur in the peripheral region adjacent to the perforated region 105, like the bendable region 101 described above, the electrically conductive adhesive layer 150 may be disposed adjacent to the perforated region 105.

Figure 8:
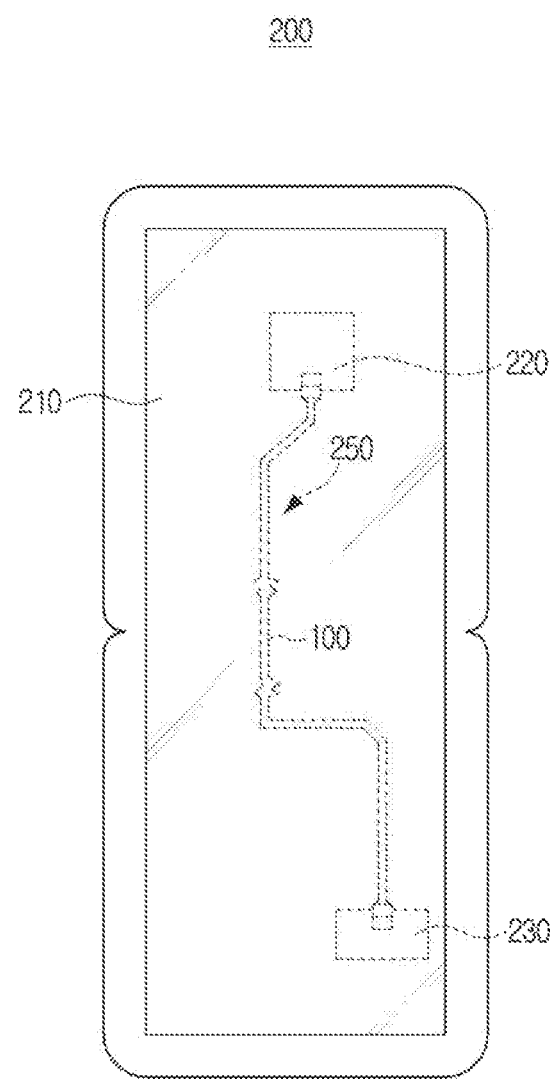
FIG. 8 is a diagram of an electronic device including an FPCB assembly according to an embodiment of the disclosure.

FIG. 8 is a diagram of an electronic device including an FPCB assembly according to an embodiment of the disclosure.

Referring to FIG. 8, an electronic device 200 according to an embodiment of the disclosure may include a flexible display 210, a first antenna 220, a second antenna 230, and an FPCB assembly 100.

The flexible display 210 is a display device including a flexible display panel, and may entirely have bendability or may be folded with respect to a foldable portion having bendability.

When the electronic device 200 is folded with respect to the foldable portion of the flexible display 210 between an upper portion and a lower portion of the electronic device 200, a first device part corresponding to the upper portion of the electronic device 200 and a second device part corresponding to the lower portion of the electronic device 200 may be separated from each other in a folded state. In addition, the electronic device 200 may be divided into a left part and a right part with respect to a foldable portion of the flexible display 210.

A plurality of components including the first antenna 220 may be disposed in the first device part, a plurality of components including the second antenna 230 may be disposed in the second device part, and the components of the first device part and the components of the second device part may be connected to each other. For convenience of explanation, the description will be focused on the first antenna 220 of the first device part and the second antenna 230 of the second device part.

In order to transmit and receive electrical signals and power in a state in which the electronic device is folded, the first device part and the second device part may be connected to each other by a cable 250 formed of a PCB including the FPCB assembly 100 that may be bent in the foldable portion. The cable 250 includes an FPCB assembly 100 region disposed in the foldable portion and RPCB assembly regions disposed on the sides of the foldable portion. The FPCB assembly 100 may be disposed only in the foldable portion.

A foldable electronic device 200 may include a flexible display 210 with antennas being disposed in a direction toward a side of an external frame. In this example, the first antenna 220 and the second antenna 230 disposed in a first device part and a second device part, respectively, of the electronic device 200 in a folded state are connected to each other by the cable 250 including the FPCB assembly 100, and accordingly, the bendability and signal transmission capability of the FPCB assembly 100 directly affect a radio reception rate. In addition, with the development of communication technology, a mobile phone may receive a broader-band frequency, and the electrically conductive layer of the FPCB assembly 100 may also transmit a higher-frequency signal. As a result, if a crack occurs, a resonance may be a problem.

Therefore, in the electronic device 200 including the FPCB assembly 100 capable of maintaining its performance even if a crack occurs in the ground layer while having ultra-high bendability according to the disclosure, it is possible to stably transmit and receive electrical signals between the first antenna 220 and the second antenna 230.

As a result, the first antenna 220 and the second antenna 230 may be disposed to be separated from each other with respect to the foldable region of the flexible display 210, and the improved FPCB assembly 100 according to an embodiment of the disclosure may connect the first antenna 220 and the second antenna 230 to each other.

In the FPCB assembly and the electronic device including the same, by disposing the auxiliary metal layer on or under the ground layer, it is possible to solve the current blocking problem caused when a crack occurs, with ultra-high bendability and improved stability.

Although embodiments of the disclosure have been each individually described above, each of the embodiments is not necessarily implemented alone, and the configuration and operation of each of the embodiments may be implemented in combination with at least one other embodiment.

Although the disclosure been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A flexible printed circuit board (FPCB) assembly comprising:
   an electrically conductive layer configured to transmit a signal;
   a dielectric layer provided on the electrically conductive layer;
   a ground layer provided on the dielectric layer;
   an auxiliary metal layer provided under the ground layer, and connecting a plurality of regions of the ground layer to each other; and
   a ground protecting layer provided on the auxiliary metal layer with the ground layer therebetween,
   wherein the electrically conductive layer, the dielectric layer, the ground layer, and the auxiliary metal layer are flexible, and wherein the ground protecting layer comprises a perforated region in which a degassing hole penetrating through the ground protecting layer in a vertical direction is formed.

2. The FPCB assembly of claim 1, wherein the auxiliary metal layer is interposed between the dielectric layer and the ground layer,
wherein the auxiliary metal layer comprises an adhesive material and electrically conductive particles in the adhesive material, and
wherein the adhesive material bonds the dielectric layer to the ground layer.

3. The FPCB assembly of claim 2, further comprising a bendable region,
wherein the electrically conductive particles of the auxiliary metal layer are provided in the bendable region.

4. The FPCB assembly of claim 1, wherein the auxiliary metal layer is interposed between the dielectric layer and the ground layer, and
wherein the auxiliary metal layer comprises a plurality of pillars having an "I"-shaped cross section and an adhesive material provided between the plurality of pillars to bond the dielectric layer and the ground layer to each other.

5. The FPCB assembly of claim 1, further comprising a bendable region,
wherein the auxiliary metal layer comprises a bridge provided on the ground layer and connecting regions around the bendable region to each other.

6. The FPCB assembly of claim 5, wherein the ground protecting layer is formed of a dielectric.

7. The FPCB assembly of claim 6, wherein each of the ground protecting layer and the dielectric layer comprise a same type of material.

8. The FPCB assembly of claim 1,
wherein the auxiliary metal layer is adjacent to the perforated region.

* * * * *